US010459049B2

(12) United States Patent
Soejima et al.

(10) Patent No.: US 10,459,049 B2
(45) Date of Patent: Oct. 29, 2019

(54) MAGNETIC RESONANCE IMAGING APPARATUS

(71) Applicant: Toshiba Medical Systems Corporation, Otawara-shi (JP)

(72) Inventors: Kazuyuki Soejima, Otawara (JP); Kazuya Okamoto, Saitama (JP)

(73) Assignee: Canon Medical Systems Corporation, Otawara-shi (JP)

( * ) Notice: Subject to any disclaimer, the term of this patent is extended or adjusted under 35 U.S.C. 154(b) by 216 days.

(21) Appl. No.: 15/481,831

(22) Filed: Apr. 7, 2017

(65) Prior Publication Data

US 2017/0293006 A1 Oct. 12, 2017

(30) Foreign Application Priority Data

Apr. 11, 2016 (JP) .................................. 2016-079104
Apr. 5, 2017 (JP) .................................. 2017-075210

(51) Int. Cl.
*G01V 3/00* (2006.01)
*G01R 33/44* (2006.01)
*G01R 33/46* (2006.01)
*G01R 33/54* (2006.01)

(52) U.S. Cl.
CPC ....... *G01R 33/446* (2013.01); *G01R 33/4616* (2013.01); *G01R 33/4625* (2013.01); *G01R 33/54* (2013.01)

(58) Field of Classification Search
CPC .................................................. G01R 33/446
USPC ................................ 324/312, 314, 318, 322
See application file for complete search history.

(56) References Cited

U.S. PATENT DOCUMENTS

| 5,160,891 A | * | 11/1992 | Keren | ............... | G01R 33/3415 |
| | | | | | 324/318 |
| 5,572,130 A | * | 11/1996 | Ratzel | ............... | G01R 33/3415 |
| | | | | | 324/318 |
| 6,104,943 A | * | 8/2000 | Frederick | .......... | G01R 33/3621 |
| | | | | | 324/309 |
| 6,573,718 B2 | * | 6/2003 | Rabe | ..................... | G01R 33/54 |
| | | | | | 324/309 |

(Continued)

FOREIGN PATENT DOCUMENTS

JP   6-233749   8/1994
JP   2002-143122   5/2002

(Continued)

*Primary Examiner* — Louis M Arana
(74) *Attorney, Agent, or Firm* — Oblon, McClelland, Maier & Neustadt, L.L.P.

(57) ABSTRACT

According to one embodiment, a MRI apparatus includes an RF coil apparatus receiving MR signals by coil elements corresponding to channels, modulating the MR signals to have different frequencies for each of the channels, and outputting an analog multiplexed signal in which the MR signals with different frequencies are composited over the channels, and a receiver including ADC circuitry converting the analog multiplexed signal to a digital multiplexed signal, and predetermined number of separation channels separating the digital multiplexed signal, based on the number of the channels relating to composition of the MR signals with the different frequencies. The receiver stops a separation process of the digital multiplexed signal for separation channels not used in the separation process among the predetermined number of separation channels.

9 Claims, 9 Drawing Sheets

(56) References Cited

U.S. PATENT DOCUMENTS

| | | | |
|---|---|---|---|
| 7,834,628 B2 * | 11/2010 | Biber | G01R 33/3415 324/318 |
| 2009/0286478 A1 | 11/2009 | Biber et al. | |
| 2015/0276899 A1 | 10/2015 | Dai et al. | |
| 2015/0285887 A1 | 10/2015 | Bollenbeck | |

FOREIGN PATENT DOCUMENTS

| | | |
|---|---|---|
| JP | 2014-138699 | 7/2014 |
| JP | 5574619 | 8/2014 |
| WO | WO 2014/098060 A1 | 6/2014 |

* cited by examiner

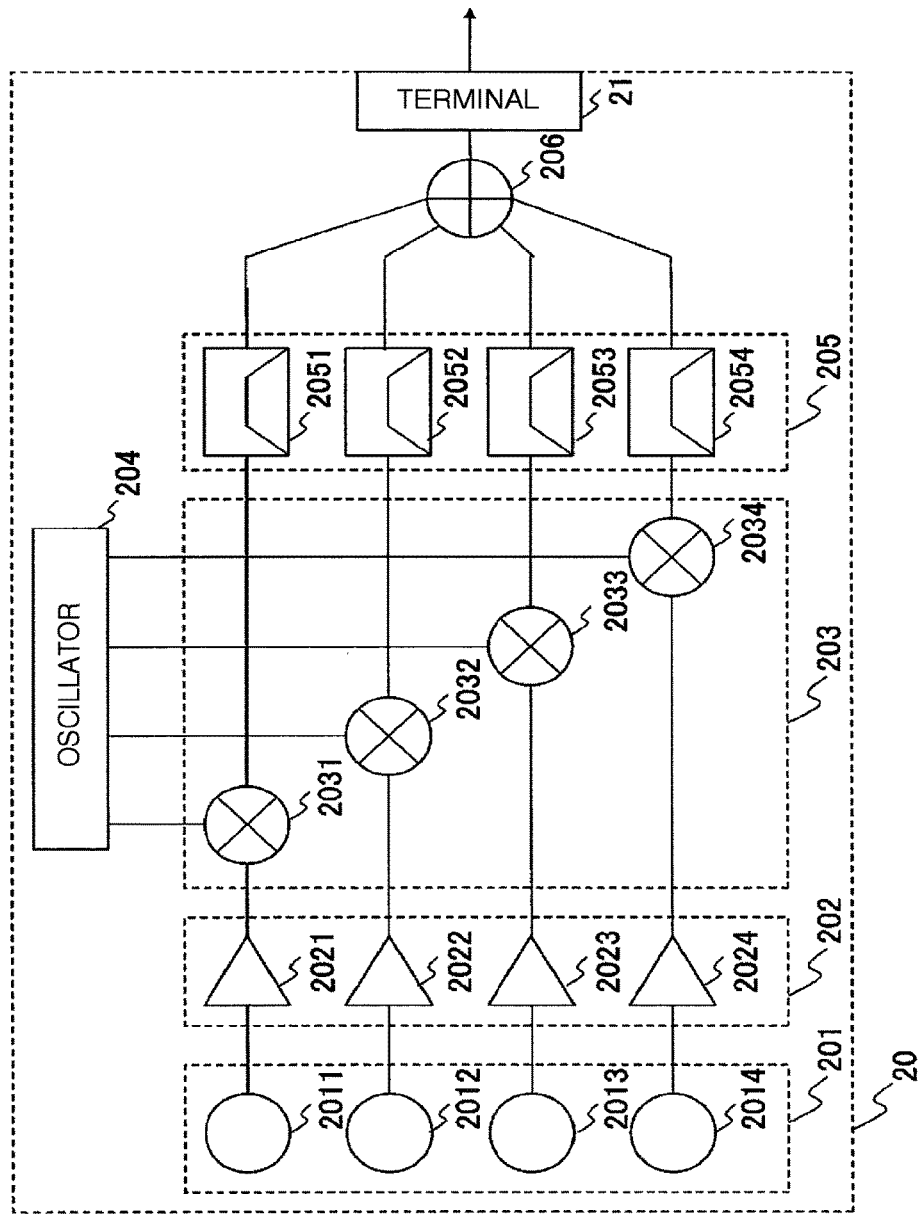
F I G. 2

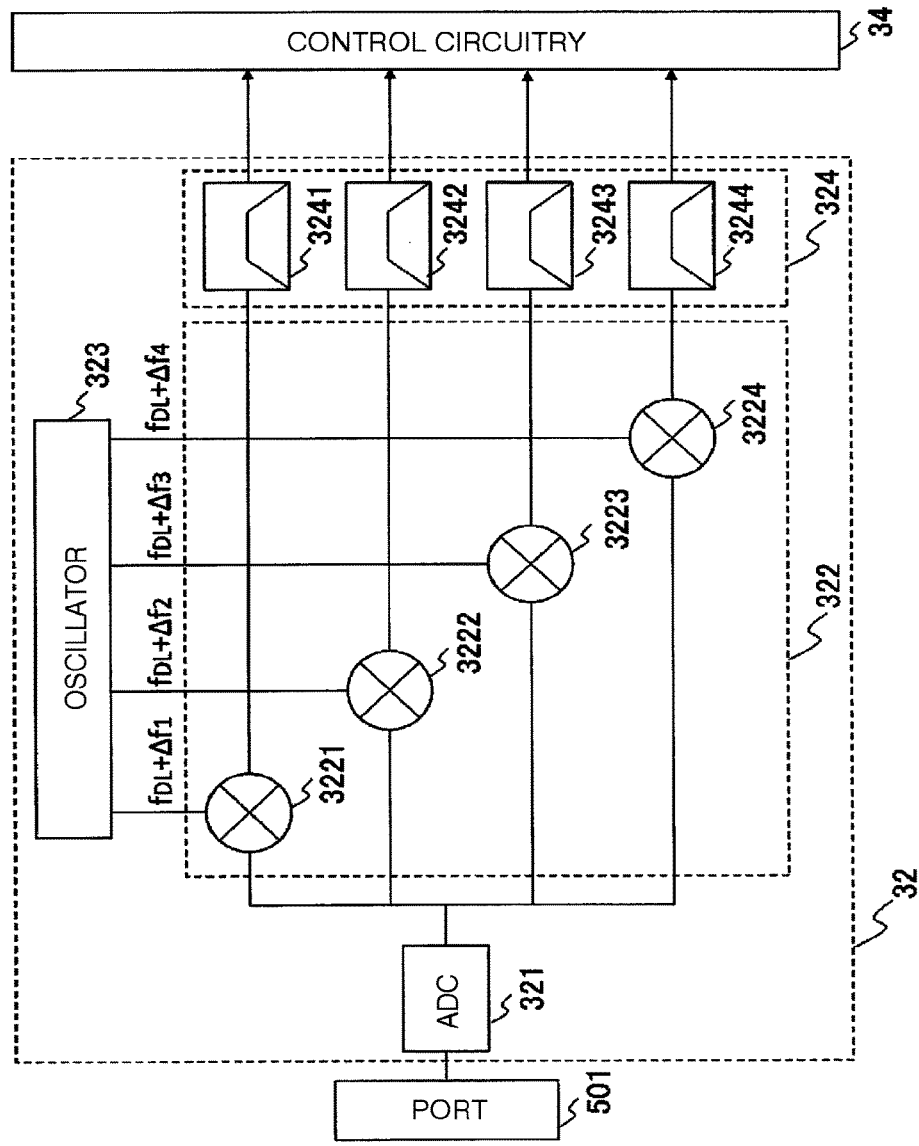
F I G. 4

MAGNETIC RESONANCE IMAGING APPARATUS

CROSS-REFERENCE TO RELATED APPLICATIONS

This application is based upon and claims the benefit of priority from the prior Japanese Patent Applications No. 2016-079104, filed Apr. 11, 2016; and No. 2017-75210, filed Apr. 5, 2017, the entire contents of all of which are incorporated herein by reference.

FIELD

Embodiments described herein relate generally to a magnetic resonance imaging apparatus.

BACKGROUND

A magnetic resonance imaging apparatus is an imaging apparatus which excites an atomic nucleus spin of a subject placed in a static magnetic field by a radio-frequency (RF) signal of the Larmor frequency, and generates an image by reconstructing a magnetic resonance signal which is generated from the subject by the excitation.

In magnetic resonance imaging apparatuses in recent years, for example, in order to acquire a high-quality image, or in order to achieve high-speed imaging, there is a tendency that the number of channels of RF coils, which receive magnetic resonance signals generated from the subject, has been increasing.

In the conventional magnetic resonance imaging apparatus, in order to cope with the increase in the number of channels of the RF coils, signals received by the RF coils are multiplexed, and the multiplexed analog signal is separated by an analog filter in association with respective reception channels.

In this conventional magnetic resonance imaging apparatus, the number of components of analog circuitry increases, leading to an increase in cost.

BRIEF DESCRIPTION OF THE DRAWINGS

FIG. 2 is a block diagram illustrating a detailed configuration relating to an RF coil apparatus according to the first embodiment.

FIG. 4 is a block diagram illustrating a detailed configuration relating to an RF receiver according to the first embodiment.

DETAILED DESCRIPTION

In general, according to one embodiment, a magnetic resonance imaging apparatus includes an RF (Radio Frequency) coil apparatus and a receiver. The RF coil apparatus receives magnetic resonance signals by a plurality of coil elements corresponding to a plurality of channels. The RF coil apparatus modulates the magnetic resonance signals to have different frequencies for each of the channels. The RF coil apparatus outputs an analog multiplexed signal in which the magnetic resonance signals with different frequencies are composited over the plurality of channels. The receiver includes analog-to-digital conversion circuitry and a predetermined number of separation channels. The analog-to-digital conversion circuitry converts the analog multiplexed signal to a digital multiplexed signal. The predetermined number of separation channels separate the digital multiplexed signal, based on a number of the channels relating to composition of the magnetic resonance signals with the different frequencies. The receiver stops a process of separation of the digital multiplexed signal for separation channels which are not used in the process of separation among the predetermined number of separation channels.

Various embodiments will be described hereinafter with reference to the accompanying drawings.

(First Embodiment)

Figure 1:
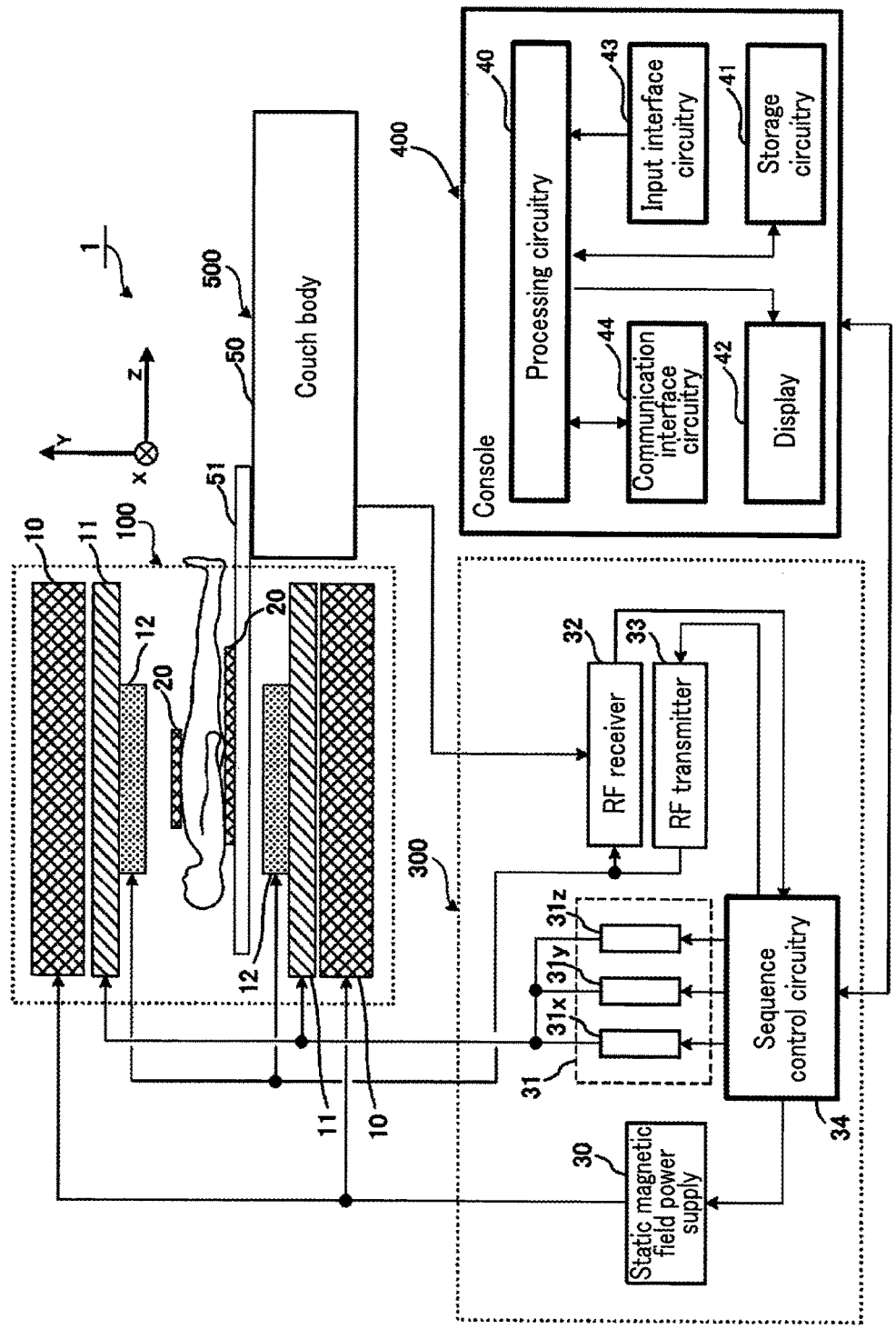
FIG. 1 is a block diagram illustrating the entire configuration of a magnetic resonance imaging apparatus according to a first embodiment.

FIG. 1 is a block diagram illustrating the entire configuration of a magnetic resonance imaging apparatus 1 according to the present embodiment. The magnetic resonance imaging apparatus 1 includes a magnetic gantry 100, a couch 500, a control cabinet 300, a console 400, a WB (Whole Body) coil 12, and an RF coil apparatus 20.

The magnetic gantry 100 includes a static field magnet 10, a gradient coil 11, and a WB coil 12. These structural parts are accommodated in a substantially cylindrical housing. The couch 500 includes a couch body 50 and a couch top 51.

The control cabinet 300 includes a static magnetic field power supply 30, a gradient magnetic field power supply 31 (X-axis gradient magnetic field power supply 31x, Y-axis gradient magnetic field power supply 31y, and Z-axis gradient magnetic field power supply 31z), an RF receiver 32, an RF transmitter 33, and sequence control circuitry 34.

The static field magnet 10 of the magnetic gantry 100 has a substantially cylindrical shape, and causes a static magnetic field in a bore into which a subject, for instance, a patient, is conveyed. The bore is a cylindrical inside space of the magnetic gantry 100. The static field magnet 10 incorporates, for example, a superconducting coil. The superconducting coil is cooled at very low temperatures by liquid helium.

The static field magnet 10 causes a static magnetic field by applying, in an excitation mode, an electric current, which is supplied from the static magnetic field power supply 30, to the superconducting coil. Thereafter, if the static field magnet 10 transitions to a permanent current mode, the static magnetic field power supply 30 is cut off. Once the static field magnet 10 transitioned to the permanent current mode, the static field magnet 10 continues generating a strong static magnetic field for a long time, for example, over one year. Incidentally, although the static field magnet 10 was described as the superconducting magnet, the static field magnet 10 is not limited to the superconducting magnet, and a static magnetic field may be formed by using a permanent magnet. Besides, the shape of the static field magnet 10 is not limited to a substantially cylindrical shape, and may have an open-type shape.

The gradient coil 11 also has a substantially cylindrical shape, and is fixed in the inside of the static field magnet 10. By the current supplied from the gradient magnetic field power supply (31$x$, 31$y$, 31$z$), the gradient coil 11 applies gradient magnetic fields to the subject in the directions of the X axis, Y axis and Z axis.

The couch body 50 of the couch 500 is capable of moving the couch top 51 in the vertical direction and horizontal direction. The couch body 50 moves the subject, which is placed on the couch top 51, up to a predetermined height prior to imaging. Thereafter, the couch body 50 moves the subject into the bore by horizontally moving the couch top 51 at a time of imaging.

The WB coil 12 is also called "whole body coil", and is fixed in the inside of the gradient coil 11 in a substantially cylindrical shape in a manner to surround the subject. The WB coil 12 transmits RF pulses, which are sent from the RF transmitter 33, to the subject, and also receives a magnetic resonance signal, that is, an MR (Magnetic Resonance) signal, which is emitted from the subject by the excitation of a hydrogen atomic nucleus.

The magnetic resonance imaging apparatus 1 includes the RF coil apparatus 20, in addition to the WB coil 12, as illustrated in FIG. 1. The RF coil apparatus 20 includes coils which are disposed in close proximity to the body surface of the subject. The RF coil apparatus 20 includes, for example, a coil for the head, a coil for the knees, a coil for the abdomen, a coil for the shoulders, a coil for the breast, and a coil for the legs. The RF coil apparatus 20 may be configured as an RF coil apparatus for both transmission and reception, or may be configured as an RF coil apparatus which is exclusively used for reception. The RF coil apparatus 20 includes a plurality of coil elements. A detailed configuration of the RF coil apparatus 20 will be described later.

The RF transmitter 33 generates RF pulses, based on an instruction from the sequence control circuitry 34. The generated RF pulses are transmitted to the WB coil 12 or RF coil apparatus 20, and applied to the subject. By the application of the RF pulses, an MR signal is generated from the subject. The WB coil 12 or RF coil apparatus 20 receives this MR signal.

In the meantime, in FIG. 1, the RF transmitter 33 is illustrated such that the RF transmitter 33 supplies RF pulses to the WB coil 12. However, for example, the RF coil apparatus 20 may be so configured as to be able to transmit RF pulses.

The MR signal received by the RF coil apparatus 20, to be more specific, the MR signal received by each of the coil elements in the RF coil apparatus 20, is output to the RF receiver 32 via a cable which connects the RF coil apparatus 20 and couch body 50. The RF receiver 32 AD (Analog-to-Digital) converts the MR signal, and outputs the AD-converted MR signal to the sequence control circuitry 34. A concrete configuration for the AD conversion of the MR signal will be described later, in conjunction with the description of the detailed configuration of the RF coil apparatus 20. The digitized MR signal is also called "raw data" in some cases. In addition, since this MR signal is spatial frequency data prior to conversion to real spatial data by Fourier transform, this MR signal is also called "k-space data" in some cases.

Under the control of the console 400, the sequence control circuitry 34 scans the subject by driving the gradient magnetic field power supply 31, RF transmitter 33 and RF receiver 32. Upon receiving the raw data from the RF receiver 32 by the scan, the sequence control circuitry 34 transmits the received raw data to the console 400.

The sequence control circuitry 34 includes processing circuitry (not shown). This processing circuitry is, for example, a processor which executes a predetermined program. The term "processor" means, for example, a CPU (Central Processing Unit), a GPU (Graphics Processing Unit), or circuitry such as an ASIC (Application Specific Integrated Circuit), or a programmable logic device (e.g. SPLD (Simple Programmable Logic Device), CLPD (Complex Programmable Logic Device), FPGA (Field Programmable Gate Array)). The processor realizes various functions by reading out programs from a storage area incorporated in the circuitry of the processor, or from the storage circuitry 41, and executing the programs. In the meantime, each of embodiments is not limited to the case in which each of respective processors is configured as single circuitry, and a plurality of independent circuitry units may be combined and configured as a single processor and the respective functions may be realized by the single processor.

The console 400 includes processing circuitry 40, storage circuitry 41, display 42, input interface circuitry 43, and communication interface circuitry 44. The console 400 functions as a host computer.

The storage circuitry 41 is storage media including a ROM (Read Only Memory) and a RAM (Random Access Memory), and also including an external storage device such as an HDD (Hard Disk Drive) or an optical disc drive. The storage circuitry 41 stores various kinds of information and data, and also stores various programs which the processors included in the processing circuitry 40 executes.

The input interface circuitry 43 is, for instance, a mouse, a keyboard, a trackball, a touch panel, etc., and includes various devices for an operator to input various kinds of information and data. The display 42 is a display device such as a liquid crystal display panel, a plasma display panel, or an organic EL panel.

The processing circuitry 40 is, for example, circuitry including a processor. The processor realizes various functions to be described later, by executing various programs stored in the storage circuitry 41. In addition, the processing circuitry 40 can also realize various functions by combining a software process by the processor and programs, and a hardware process.

The communication interface circuitry 44 transmits/receives information to/from an external device or a facility such as a customer service center, via a network such as a LAN (Local Area Network) or Internet.

FIG. 2 is a block diagram illustrating a detailed configuration relating to the RF coil apparatus 20 according to the present embodiment.

The RF coil apparatus 20 includes coil elements 201, amplifiers 202, multipliers 203, an oscillator 204, filters 205, an adder (composition circuitry) 206, and a terminal 21. Specifically, the RF coil apparatus 20 receives magnetic resonance signals by a plurality of coil elements corresponding to a plurality of channels, modulates the magnetic resonance signals to have different frequencies for each of the channels, and outputs to the RF receiver 32 an analog multiplexed signal in which the magnetic resonance signals with the different frequencies are composited over the plural channels. FIG. 2 illustrates a configuration in which the RF coil apparatus 20 includes four coil elements. In the description below, it is also assumed that the RF coil apparatus 20 includes four coil elements, but it is not intended that the number of coil elements is limited to four.

The coil elements 201 receive MR signals which are generated from the subject. In FIG. 2, the RF coil apparatus 20 includes four coil elements 2011, 2012, 2013 and 1014. Incidentally, the term "coil element 201" is a general term for the plural coil elements surrounded by a broken line in FIG. 2. In the meantime, signal paths in the RF coil apparatus 20, through which the received MR signals are passed, are referred to as "reception channels", and the reception channels corresponding to the coil elements 2011, 2012, 2013 and 2014 are referred to as "reception channel 1", "reception channel 2", "reception channel 3" and "reception channel 4", respectively.

The amplifiers 202 amplify the MR signals which the coil elements 201 received. In FIG. 2, the RF coil apparatus 20 includes four amplifiers 2021, 2022, 2023 and 2024. Incidentally, the term "amplifier 202" is a general term for the plural amplifiers surrounded by a broken line in FIG. 2.

The oscillator 204 generates signals of predetermined frequencies. The signals generated by the oscillator 204 are also called "local signals". The local signals, which are supplied to the respective channels, have mutually different frequency components. Incidentally, it is not intended that the oscillator 204 is restricted to such a configuration that the oscillator 204 is independently provided in the RF coil apparatus 20. For example, the RF receiver 32 and oscillator 204 may be commonly constructed by acquiring local signals which are generated by the RF receiver 32.

The multipliers 203 output multiplication results by multiplying the signals, which are output from the amplifiers 202, by the signals which are supplied from the oscillator 204. Specifically, the multipliers 203 are multiplication circuitry, which multiplies, with respect to each of the channels, each of the local signals having different frequencies between the respective channels, by each of the magnetic resonance signals which are output from the respective channels. In FIG. 2, the RF coil apparatus 20 includes four multipliers 2031, 2032, 2033 and 2034. Incidentally, the term "multiplier 203" is a general term for the plural multipliers surrounded by a broken line in FIG. 2.

The filters 205 pass and output only predetermined frequency components of the signals which are output from the multipliers 203. In FIG. 2, the RF coil apparatus 204 includes four filters 2051, 2052, 2053 and 2054. Incidentally, the term "filter 205" is a general term for the plural filters surrounded by a broken line in FIG. 2.

The adder 206 adds the signals which are output from the filters 205. A signal, which is output from the adder 206, is referred to as "multiplexed signal".

The terminal 21 is a component which is connected to the couch body 50 in order to transmit the multiplexed signal, which is output from the adder 206, to the RF receiver 32 via the couch 500. The terminal 21 includes one or plural signal lines, and transmits the multiplexed signal.

Figure 3:
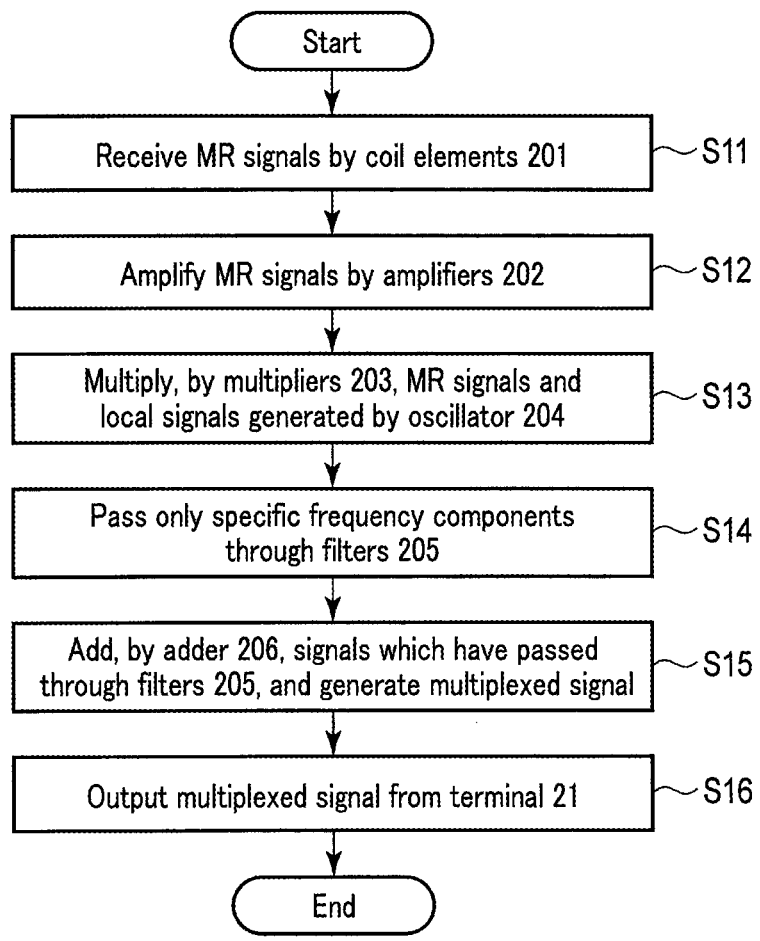
FIG. 3 is a flowchart illustrating a flow in the first embodiment from the reception of MR signals by coil elements to the output of a signal from the terminal to a couch body.

Here, referring to a flowchart of FIG. 3, a description is given of a flow in the RF coil apparatus 20 from the reception by the coil elements 201 of the MR signals generated from the subject to the output of the signal from the terminal 21 to the couch body 50.

In step S11, the coil elements 201 receive MR signals.

In step 512, the amplifiers 202 amplify the MR signals. If a signal at a time when the MR signal received by the reception channel 1 was amplified is $SIG_1$, the signal $SIG_1$ can be expressed as follows by using an amplitude $A_1$, time t and a frequency $f_{mr}$ of the MR signal:

$$SIG_1 = A_1(t)\cos(2\pi f_{mr} t)$$

where $f_{mr}$ is a frequency corresponding to a magnetic field strength which is proportional to the Larmor frequency.

Similarly, as regards the reception channel 2, reception channel 3 and reception channel 4, signals $SIG_2$, $SIG_3$ and $SIG_4$ at times when the MR signals were amplified can be expressed as follows:

$$SIG_2 = A_2(t)\cos(2\pi f_{mr} t)$$

$$SIG_3 = A_3(t)\cos(2\pi f_{mr} t)$$

$$SIG_4 = A_4(t)\cos(2\pi f_{mr} t)$$

where $A_2$, $A_3$ and $A_4$ are the amplitudes of the signals of the respective channels.

In step S13, the multipliers 203 multiply the amplified MR and local signals generated by the oscillator 204. The multipliers 203 vary the frequency components between the respective reception channels, so that the signal components of the respective reception channels, which are included in the multiplexed signal, can be distinguished.

A local signal $LO_1$, which is generated by the oscillator 204 and is supplied to the reception channel 1, is, for example, a sine wave of a frequency $(f_L + \Delta f_1)$, and can be expressed as follows:

$$LO_1 = \cos\{2\pi(f_L + \Delta f_1)t\}.$$

Then, a signal, which is obtained by multiplying the MR signal $SIG_1$ and local signal $LO_1$, can be expressed as follows:

$$SIG_1 \times LO_1 = A_1(t)\cos(2\pi f_{mr} t) \times \cos(2\pi(f_L + \Delta f_1)t) =$$
$$1/2 \cdot A_1(t)\cos(2\pi(f_{mr} - (f_L + \Delta f_1))t) +$$
$$1/2 \cdot A_1(t)\cos(2\pi(f_{mr} + (f_L + \Delta f_1))t).$$

Similarly, as regards the reception channel 2, reception channel 3 and reception channel 4, signals, which are obtained by multiplying the MR signals and local signals, can be expressed as follows:

$$SIG_2 \times LO_2 = 1/2 \cdot A_2(t)\cos(2\pi(f_{mr} - (f_L + \Delta f_2))t) +$$
$$1/2 \cdot A_2(t)\cos(2\pi(f_{mr} + (f_L + \Delta f_2))t)$$
$$SIG_3 \times LO_3 = 1/2 \cdot A_3(t)\cos(2\pi(f_{mr} - (f_L + \Delta f_3))t) +$$
$$1/2 \cdot A_3(t)\cos(2\pi(f_{mr} + (f_L + \Delta f_3))t)$$
$$SIG_4 \times LO_4 = 1/2 \cdot A_4(t)\cos(2\pi(f_{mr} - (f_L + \Delta f_4))t) +$$
$$1/2 \cdot A_4(t)\cos(2\pi(f_{mr} + (f_L + \Delta f_4))t)$$

where $LO_2$, $LO_3$, and $LO_4$ are local signals which are multiplied by the signals of the respective reception channels. In addition, $(f_L + \Delta f_2)$, $(f_L + \Delta f_3)$ and $(f_L + \Delta f_4)$ are the frequencies of the local signals which are supplied to the respective reception channels. It should be noted, however, that $\Delta f_1$, $\Delta f_2$, $\Delta f_3$ and $\Delta f_4$ are mutually different values.

In step S14, the filters 205 pass only signals of specific frequency bands of the signals obtained as the results of the multiplications by the multipliers 203. The signal, which is obtained as the result of the multiplication in the reception channel 1, includes two frequency components, i.e. $(f_{mr}-(f_L+\Delta f_1))$ and $(f_{mr}+(f_L+\Delta f_1))$, but the desired component is the low-frequency component. The filter 2051 takes out only the low-frequency component. This process is called "down conversion", and a signal obtained by the down conversion is called "intermediate-frequency signal". An intermediate-frequency signal $IF_1$ in the reception channel 1 can be expressed as follows:

$$IF_1 = \tfrac{1}{2} \cdot A_1(t) \cos(2\pi(f_{mr}-(f_L+\Delta f_1))t).$$

Similarly, as regards the reception channel 2, reception channel 3 and reception channel 4, intermediate-frequency signals $IF_2$, $IF_3$ and $IF_4$ can be expressed as follows:

$$IF_2 = 1/2 \cdot A_2(t) \cos(2\pi(f_{mr}-(f_L+\Delta f_2))t)$$

$$IF_3 = 1/2 \cdot A_3(t) \cos(2\pi(f_{mr}-(f_L+\Delta f_3))t)$$

$$IF_4 = 1/2 \cdot A_4(t) \cos(2\pi(f_{mr}-(f_L+\Delta f_4))t).$$

In step S15, the adder 206 adds the intermediate-frequency signals which the filters 205 output, and outputs a multiplexed signal. A multiplexed signal MLT, which is output, can be expressed as follows:

$$MLT = 1/2[A_1(t)\cos(2\pi(f_{mr}-(f_L+\Delta f_1))t) + A_2(t)\cos(2\pi(f_{mr}-(f_L+\Delta f_2))t) + A_3(t)\cos(2\pi(f_{mr}-(f_L+\Delta f_3))t) + A_4(t)\cos(2\pi(f_{mr}-(f_L+\Delta f_4))t)].$$

In step S16, the terminal 21 outputs the multiplexed signal MLT.

Since the above-described MR signals received by the respective coil elements are multiplied by making different the respective frequency components, the RF receiver 32 can separate the signal components in association with the respective channels.

FIG. 4 is a block diagram illustrating a detailed configuration relating to the RF receiver 32 according to the present embodiment.

The RF receiver 32 receives the analog multiplexed signal from a port 51 which is provided on the couch body 50. The RF receiver 32 includes an ADC (analog-to-digital converter (analog-to-digital conversion circuitry)) 321, multipliers 322, an oscillator 323, and filters 324. The multipliers 322, oscillator 323 and filters 324 correspond to a predetermined number of separation channels. The separation channels separate the digital multiplexed signal, based on a number of reception channels relating to the above-described composition of the magnetic resonance signals with the different frequencies. A part or the entirety of the RF receiver 32 is composed of, for example, an FPGA. Incidentally, in the RF receiver 32, the path, through which the digital signal corresponding to the reception channel 1 of the coil element 201 is output to the sequence control circuitry 34, is referred to simply as "channel 1". Similarly, the signal paths of the RF receiver 32, which correspond to the other reception channels of the RF coil apparatus 20, are referred to as "channel 2", "channel 3" and "channel 4".

The ADC 321 is circuitry which converts an analog signal to a digital signal. The ADC 321 converts the analog multiplexed signal, which is output from the port 501, to a digital multiplexed signal.

The oscillator 323 generates signals of predetermined frequencies. The signals generated by the oscillator 323 are also called "local signals". The local signals, which are supplied to the respective channels, include mutually different frequency components. Specifically, the oscillator 323 generates local signals having different frequencies between the respective channels.

The multipliers 322 output signals which are results of multiplication between the digital multiplexed signal, which is output from the ADC 321, and the local signals generated by the oscillator 323. In FIG. 4, the RF receiver 32 includes four multipliers 3221, 3222, 3223 and 3224. Incidentally, the term "multiplier 322" is a general term for the plural multipliers surrounded by a broken line in FIG. 4. The multipliers 322 are multiplication circuitry which multiplies the digital multiplexed signal by the local signals, and outputs signals having common frequency bands between the separation channels.

The filters 324 pass and output only predetermined frequency components of the signals which are output from the multipliers 322. In FIG. 4, the RF receiver 32 includes four filters 3241, 3242, 3243 and 3244. The four filters include common pass bands. Incidentally, the term "filter 324" is a general term for the plural filters surrounded by a broken line in FIG. 4. The filters 324 pass signals which are output from the multiplication circuitry, by using the pass bands which are common between the separation channels.

Figure 5:
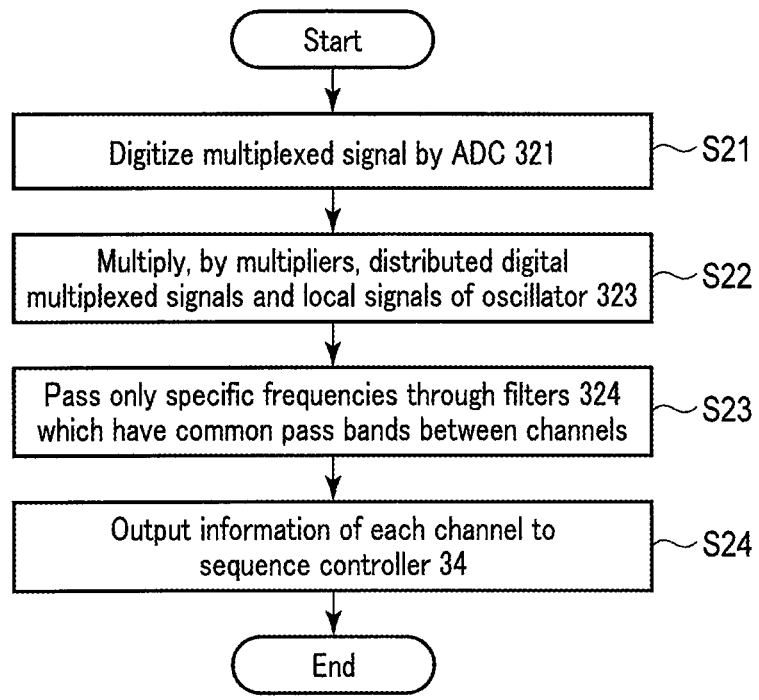
FIG. 5 is a flowchart illustrating a flow in the first embodiment from the conversion of an analog multiplexed signal, which was received by a port, to a digital signal, to the supply of the digital signal to sequence control circuitry.

Here, referring to a flowchart of FIG. 5, a description is given of a flow in the RF receiver 32 from the conversion of the analog multiplexed signal received by the port 501 to a digital signal, to the supply of signals to the sequence control circuitry 34.

In step S21, the ADC 321 converts the analog multiplexed signal MLT to a digital multiplexed signal DMLT. Signal processing in the rear stage of the ADC 321 is digital signal processing. The digital multiplexed signal DMLT can be expressed as follows:

$$DMLT = \alpha[A_1(t)\cos(2\pi(f_{mr}-(f_L+\Delta f_1))t) + A_2(t)\cos(2\pi(f_{mr}-(f_L+\Delta f_2))t) + A_3(t)\cos(2\pi(f_{mr}-(f_L+\Delta f_3))t) + A_4(t)\cos(2\pi(f_{mr}-(f_L+\Delta f_4))t)]$$

where $\alpha$ is an arbitrary coefficient.

In step S22, the multipliers 322 multiply the multiplexed signals, which are distributed for the respective channels, and local signals which are generated by the oscillator 323 and include frequency components that are different between the respective channels. A local signal $DLO_1$, which is supplied to the channel 1, is, for example, a sine wave of a frequency $(f_{DL}+\Delta f_1)$, and can be expressed as follows:

$$DLO_1 = \cos\{2\pi(f_{DL}+\Delta f_1)t\}.$$

Then, a signal, which is obtained by multiplying the multiplexed signal DMLT and local signal $DLO_1$, can be expressed as follows:

$$DMLT \times DLO_1 =$$

$$\alpha[A_1(t)\cos(2\pi(f_{mr}-(f_L+\Delta f_1))t)+A_2(t)\cos(2\pi(f_{mr}-(f_L+\Delta f_2))t)+$$

$$A_3(t)\cos(2\pi(f_{mr}-(f_L+\Delta f_3))t)+$$

$$A_4(t)\cos(2\pi(f_{mr}-(f_L+\Delta f_4))t)]\times\cos\{2\pi(f_{DL}+\Delta f_1)t\}=$$

$$1/2\cdot\alpha[A_1(t)\cos(2\pi(f_{mr}-(f_L+f_{DL})t)+$$

$$A_1(t)\cos(2\pi(f_{mr}-f_L-f_{DL}-2\Delta f_1)t)+$$

$$A_2(t)\cos(2\pi(f_{mr}-(f_L+\Delta f_2)+(f_{DL}+\Delta f_1))t)+$$

$$A_2(t)\cos(2\pi(f_{mr}-(f_L+\Delta f_2)-(f_{DL}+\Delta f_1))t)+$$

$$A_3(t)\cos(2\pi(f_{mr}-(f_L+\Delta f_3)+(f_{DL}+\Delta f_1))t)+$$

$$A_3(t)\cos(2\pi(f_{mr}-(f_L+\Delta f_3)-(f_{DL}+\Delta f_1))t)+$$

$$A_4(t)\cos(2\pi(f_{mr}-(f_L+\Delta f_4)+(f_{DL}+\Delta f_1))t)+$$

$$A_4(t)\cos(2\pi(f_{mr}-(f_L+\Delta f_4)-(f_{DL}+\Delta f_1))t)].$$

In step S23, the filters 324 pass only signals of specific frequency bands of the signals which are output from the multipliers 322. The signal, which is output from the multiplier 322 in the channel 1 includes a plurality of frequency components, but the desired component is a frequency component which includes no information of the channels other than the channel 1. Of the signal output from the multiplier 322 in the channel 1, the filter 324 passes only a signal with a frequency component of $(f_{mr}-f_L+f_{DL})$. In this manner, it becomes possible to extract only the information of the channel 1 from the multiplexed signal. Similarly, as regards the other channels, it is possible to extract only the information of specific channels from the multiplexed signal. Specifically, local signals with frequencies $(f_{DL}+\Delta f_2)$, $(f_{DL}+\Delta f_3)$ and $(f_{DL}+\Delta f_4)$ may be supplied to the channels 2, 3 and 4, and only signals of frequency components $(f_{mr}-f_L+f_{DL})$ of the signals, which were obtained by multiplying the multiplexed signal DMLT and the respective local signals, may be passed.

In step S24, signals, which are output from the filters 324 and are separated between the respective channels, are output to the sequence control circuitry 34.

According to the above steps, the multiplexed signal DMLT is multiplied by the local signals that are different between the channels, and the resultant signals are passed through the filters having the common pass bands. Thereby, the multiplexed signal DMLT is separated into signals corresponding to the respective reception channels of the RF coil apparatus 20, and the separated signals are output to the sequence control circuitry 34.

(Modification 1)

In the above-described flow of separating the multiplexed signal to signals corresponding to the respective reception channels and outputting the signals to the sequence control circuitry 34, the mutually different local signals are supplied to the respective channels, and the signals multiplied with the local signals are passed through the filters having the common pass bands. However, the configuration of the embodiment is not limited to this configuration.

Figure 6:
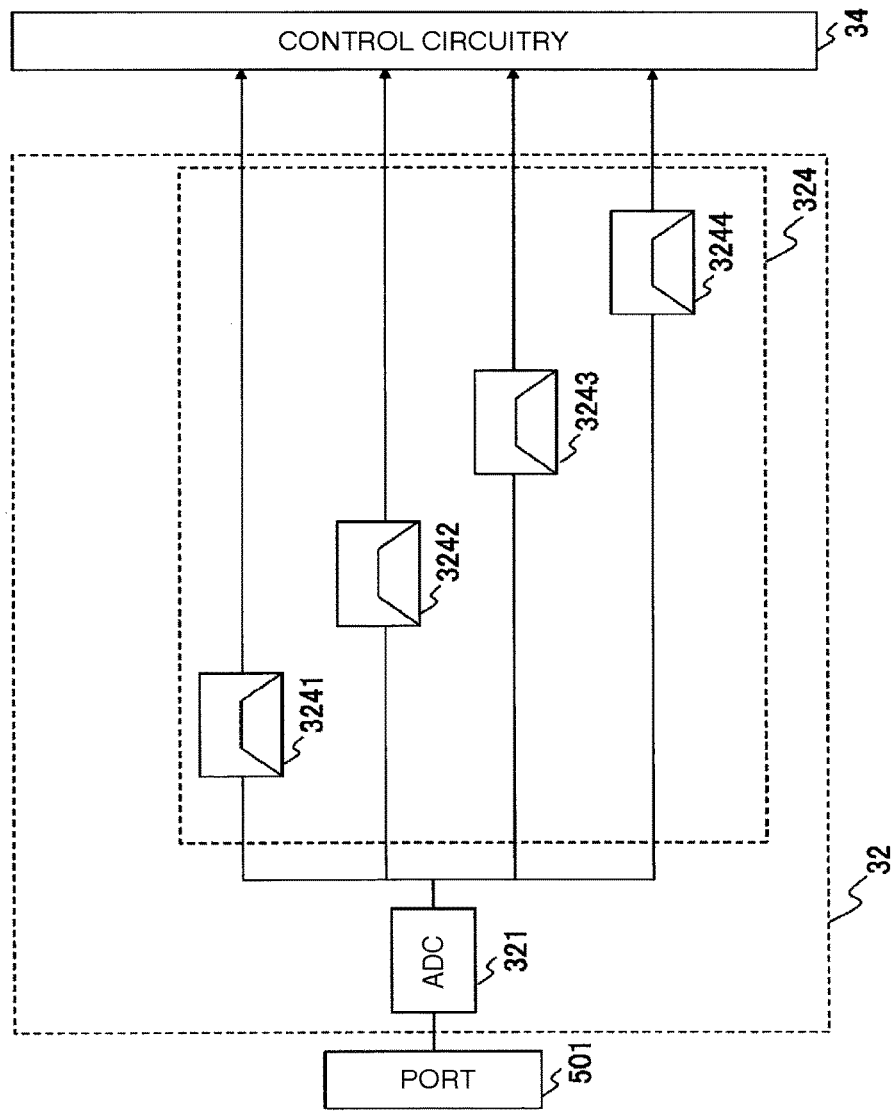
FIG. 6 is a block diagram illustrating a detailed configuration relating to an RF receiver 32 according to Modification 1.

FIG. 6 is a block diagram illustrating a detailed configuration relating to an RF receiver 32 according to Modification 1. The configuration illustrated in FIG. 6 differs from the configuration in FIG. 4 in that local signals, which are different between the channels, are not supplied. The configurations of the port 501 and ADC 321 are the same as described above.

The filters 324 have pass bands corresponding to the respective channels of the digital multiplexed signals which are output from the ADC 321, and pass and output only specific frequency components of the digital multiplexed signals.

For example, the pass bands of the filters corresponding to the channels 1, 2, 3 and 4 are $(f_{mr}-(f_L+\Delta f_1))$, $(f_{mr}-(f_L+\Delta f_2))$, $(f_{mr}-(f_L+\Delta f_3))$ and $(f_{mr}-(f_L+\Delta f_4))$, respectively.

Figure 7:
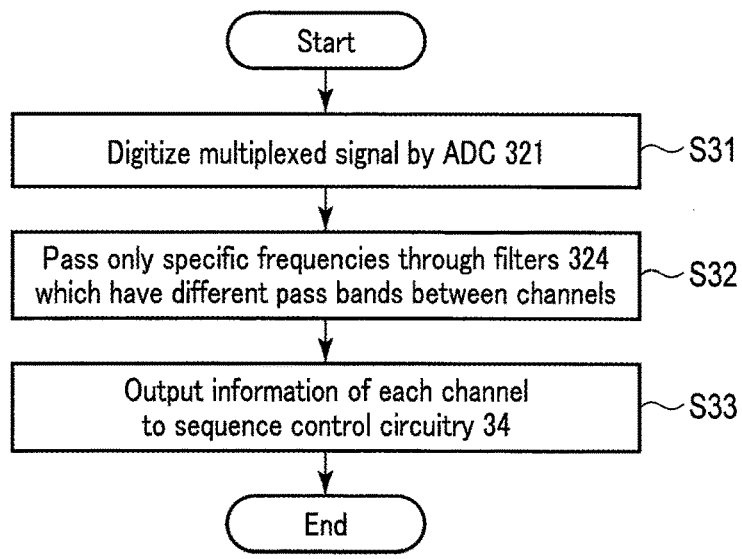
FIG. 7 is a flowchart illustrating a flow in Modification 1 from the conversion of an analog multiplexed signal, which was received by the port, to a digital signal, to the supply of the digital signal to sequence control circuitry.

Here, referring to a flowchart of FIG. 7, a description is given of a flow in the RF receiver 32 of Modification 1 from the conversion of the analog multiplexed signal received by the port 501 to the digital signal, to the supply of signals to the sequence control circuitry 34.

In step S31, the ADC 321 converts the analog multiplexed signal MLT to a digital multiplexed signal DMLT. Signal processing in the rear stage of the ADC 321 is digital signal processing. The digital multiplexed signal DMLT can be expressed in the same manner as described in connection with step S21 of FIG. 5.

In step S32, the filters 324 pass only signals of specific frequency bands of the multiplexed signals DMLT. In the respective channels, the signals, which are output through the filters 324, can be expressed as follows:

| | |
|---|---|
| $\alpha\cdot A_1(t)\cos(2\pi(f_{mr}-(f_L+\Delta f_1))t)$ | Channel 1 |
| $\alpha\cdot A_2(t)\cos(2\pi(f_{mr}-(f_L+\Delta f_2))t)$ | Channel 2 |
| $\alpha\cdot A_3(t)\cos(2\pi(f_{mr}-(f_L+\Delta f_3))\ t)$ | Channel 3 |
| $\alpha\cdot A_4(t)\cos(2\pi(f_{mr}-(f_L+\Delta f_4))t)$ | Channel 4 |

In step S33, the signals, which are output from the filters 324 and are separated between the respective channels, are output to the sequence control circuitry 34.

According to the above-described first embodiment, in the RF coil apparatus 20, the reception signals are multiplied over the plural reception channels, and the multiplexed signal is output as the analog signal. The RF receiver 32 converts the analog multiplexed signal to the digital multiplexed signal, and then separates the multiplexed signal between the respective channels, and the outputs the separated signals to the sequence control circuitry 34.

According to this configuration, compared to the case in which the analog multiplexed signal is separated into signals between the respective channels by analog circuitry and thereafter the separated signals are converted to digital signals, the number of analog circuitry components such as ADCs can be reduced. Therefore, the cost can be reduced. Moreover, the circuitry configuration can be simplified.

Besides, in the receiver 32 of the first embodiment, local signals, which are different between the channels, are supplied to the respective channels from the oscillator 323, and only specific frequency components are passed through the filters 324 with common pass bands. Thereby, the kinds of filters 324, which need to be stored in advance, can be reduced. Therefore, a memory capacity, which is required for, for example, an FPGA, which constitutes the receiver 32, can be saved.

(Second Embodiment)

A magnetic resonance imaging apparatus 1 according to a second embodiment includes a function of judging whether the RF coil apparatus 20, which is connected to the port 501, is an RF coil apparatus which outputs a multiplexed signal or not. A description of the content of the present embodiment, which overlaps the first embodiment, is omitted here. In addition, in the description below, those parts of this embodiment, which are common to the first embodiment, are denoted by the same reference numerals.

Hereinafter, as a different configuration from the first embodiment, a terminal 21 and a judgement function 45 of the processing circuitry 40 will be described.

The terminal 21 includes one or plural signal lines. The terminal 21 includes, as plural signal liens, a signal line for causing a destination of connection of the terminal 21 to recognize identification information of the RF coil apparatus 20, as well as a signal line for transmitting a multiplexed signal. The identification information of the RF coil apparatus 20 is, for example, information indicating how many channels are multiplexed when the multiplexed signal is output by the RF coil 20 via the terminal 21. In addition, the identification information of the RF coil apparatus 20 is not limited to the information which includes the number of multiplexed reception channels. For example, the identification information of the RF coil apparatus 20 may be information of the model type of the RF coil apparatus 20. At this time, by using the model type information which was read out by the destination of connection of the terminal 21, the processing circuitry 40 refers to a correspondence table between the model type information and the number of multiplexed channels, the correspondence table being prestored, for example, in the storage circuitry 41. Thereby, the processing circuitry 40 acquires information as to which channels are multiplexed channels or how many channels are multiplexed.

Figure 8:
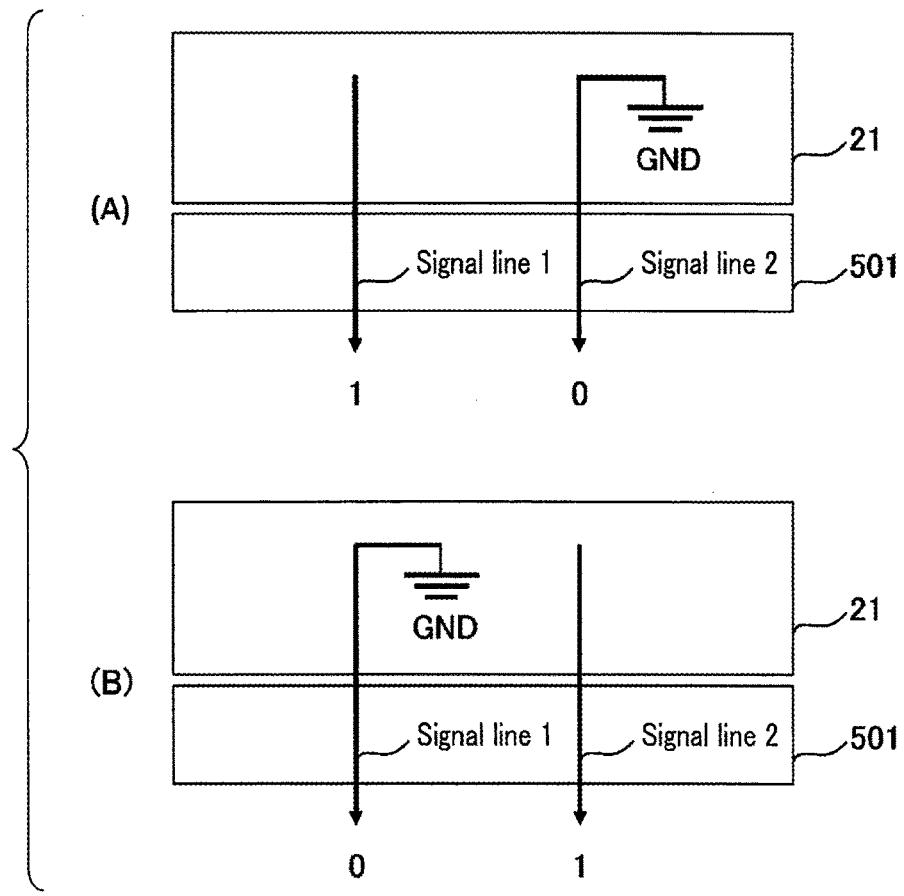
FIG. 8 is a view illustrating an example in which the RF coil apparatus according to the second embodiment supplies identification information to a terminal by using analog circuitry.

FIG. 8 illustrates a case of using analog circuitry, as an example in which identification information of the RF coil apparatus 20 is supplied to the terminal 21. The terminal 21 is connected to the port 501 which is provided on, for example, the couch body 50 of the couch 500. FIG. 8 illustrates a configuration in which the terminal 21 includes two signal lines, and the port 501 includes two signal lines corresponding to the two signal lines of the terminal 21. The two signal lines are referred to as "signal line 1" and "signal line 2", respectively.

Part (A) of FIG. 8 illustrates a state in which the signal line 2 of the terminal 21 is connected to a ground GND, and the signal line 1 of the terminal 21 is not connected to the ground GND. The state of the signal line 1 of the port 501 is a state of a non-zero voltage value, which indicates a state in which the signal line is not connected to the ground GND. On the other hand, the state of the signal line 2 of the port 501 is a state of a zero voltage value, which indicates a state in which the signal line is connected to the ground GND. If the case of the zero voltage value of the signal line is defined as 0, and the case of the non-zero voltage value of the signal line is defined as 1, and if the states of the signal line 1 and signal line 2 are expressed by binary numbers in the form of "signal line 1" and "signal line 2", the identification information, which the terminal 21 causes the port 501, which is the destination of connection of the terminal 21, to recognize, becomes information "10". On the other hand, part (B) of FIG. 8 illustrates a state in which the signal line 1 of the terminal 21 is connected to the ground GND and the signal line 2 is not connected to the ground GND. Like the case of part (A) of FIG. 8, if the identification information is found from the connection states of signal lines, the identification information becomes "01". In this manner, the port 501 can recognize the identification information of the connected RF coil apparatus 20, from the states of voltage values or the like of the signal lines of the terminal 21, these states corresponding to the identification information.

As regards the above-described acquisition of the identification information of the RF coil apparatus 20, the case was illustrated in which the terminal 21 is provided with two signal lines for identification information, but the number of signal lines is not limited to two. In the case in which the number of kinds of RF coil apparatuses 20 to be identified increases, it is possible to adapt to this case by increasing the number of signal lines for the identification information. Besides, the method of supplying signals relating to identification information from the terminal 21 is not limited to the method realized as analog circuitry. For example, the RF coil apparatus 20 may be configured to include a storage medium such as a flash storage, and identification information may be supplied from this storage medium.

Figure 9:
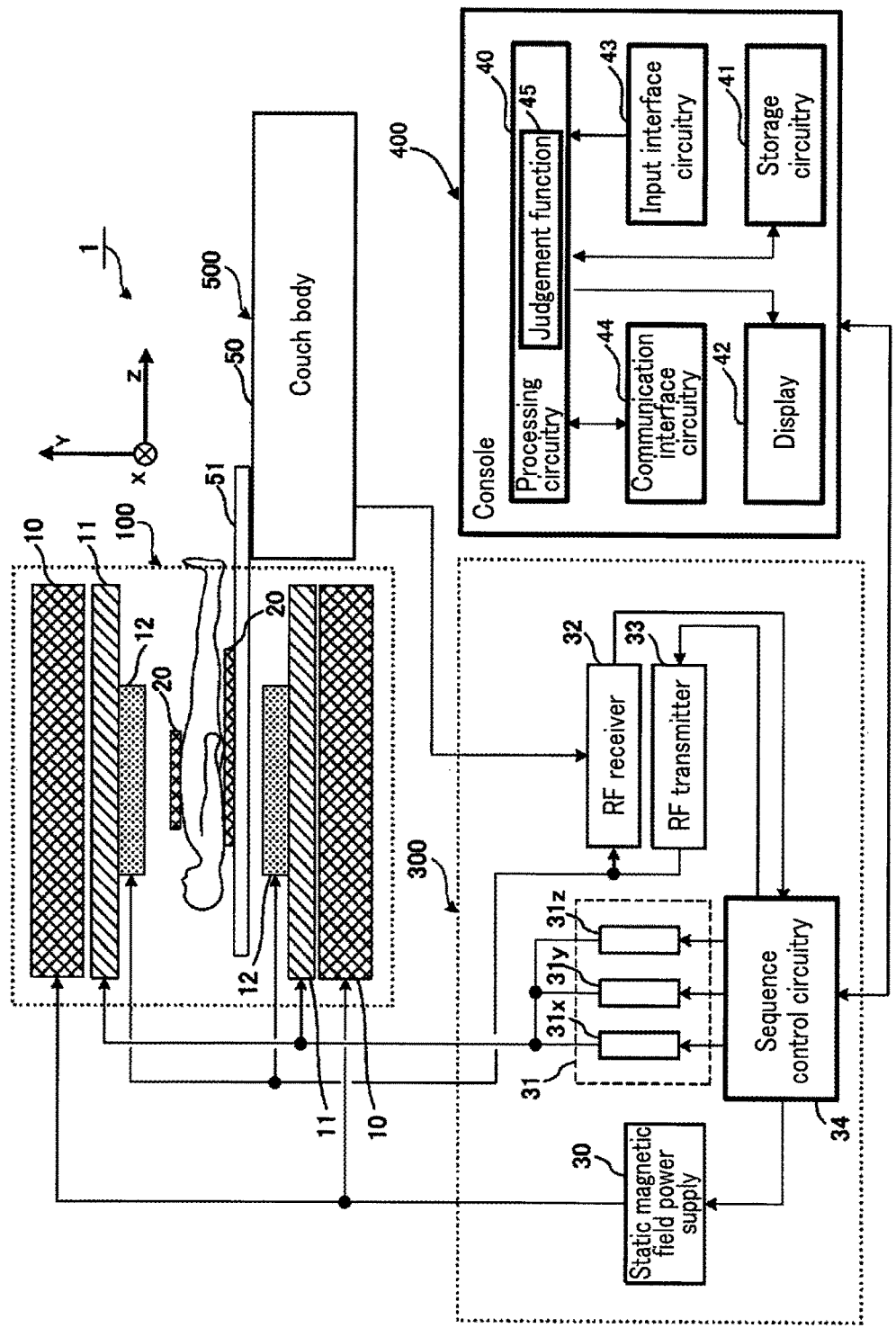
FIG. 9 is a block diagram illustrating the entire configuration of a magnetic resonance imaging apparatus according to a second embodiment.

As illustrated in FIG. 9, the processing circuitry 40 includes a judgement function 45. Except for the judgement function 45, the structural parts of the magnetic resonance imaging apparatus 1 are basically the same as those described with reference to FIG. 1. The judgement function 45 is an example of a judgement unit. Based on the identification information of the RF coil apparatus 20, the judgement function 45 judges whether or not the RF coil apparatus 20 is an RF coil apparatus which outputs a multiplexed signal.

For example, by the judgement function 45, the processing circuitry 40 acquires identification information which is supplied from the terminal 21. Then, the processing circuitry 40 executes judgement by reading out the relationship between the identification information and the information as to whether the RF coil apparatus 20 outputs a multiplexed signal. The relationship between the identification information and the presence/absence of the multiplexed signal is prestored in the storage circuitry 41. In the meantime, in the case in which the RF coil apparatus 20 is not configured to supply the identification information as to whether or not to output the multiplexed signal, that is, in the case in which the processing circuitry 40 cannot acquire the identification information of the RF coil apparatus 20 by the judgement function 45, the processing circuitry 40 judges, by the judgement function 45, that the RF coil apparatus 20 is a coil which does not output a multiplexed signal.

Additionally, for example, the processing circuitry 40 may acquire, by the judgement function 45, the identification information of the RF coil apparatus 20 via the input interface circuitry 43 or communication interface circuitry 44, and may use the identification information. Besides, based on the acquired identification information, the processing circuitry 40 may judge whether the RF coil apparatus 20 outputs a multiplexed signal.

When the processing circuitry 40 judged, by the judgement function 45, that a multiplexed signal is being output from the RF coil apparatus 20, the processing circuitry 40 further acquires, by the judgement function 45, information as to which channels of the channels included in the RF coil apparatus 20 are the channels from which signals are multiplexed and output. The information as to which channels of the RF coil apparatus 20 are the channels of multiplexed magnetic resonance signals may be acquired via the signal lines of the terminal 21 as a piece of identification information relating to the RF coil apparatus 20, or may be acquired by being read out of the storage circuitry 41 of the console 400. The information, which is read out of the storage circuitry 41 of the console 400 is, for example, information which is acquired and input via the input interface circuitry 43 or communication interface circuitry 44.

The processing circuitry 40 can identify, by the judgement function 45, the RF coil apparatus 20 which does not output the multiplexed signal. Hereinafter, in connection with the RF coil apparatus 20 and RF receiver 32, a description is given of a configuration for adapting to an RF coil apparatus which does not output a multiplexed signal, unlike the RF coil apparatus 20.

The RF coil apparatus 20 sufficiently lowers a local signal which is supplied to one reception channel among a plurality of reception channels. The RF coil apparatus, which does not output a multiplexed signal, outputs a signal of the Larmor frequency. Thus, for example, the frequency component, $(f_{mr}-(f_L+\Delta f_1))$, of the intermediate frequency signal of the reception channel 1, which was described in the first embodiment, is made closer to $f_{mr}$.

The RF receiver 32 executes a process of separating the multiplexed signal corresponding to the frequency components of the respective reception channels of the RF coil apparatus 20. Thus, the RF receiver 32 is configured to be capable of processing the frequency of a signal which is output from the RF coil apparatus that is configured such that at least one reception channel does not output a multiplexed signal.

Figure 10:
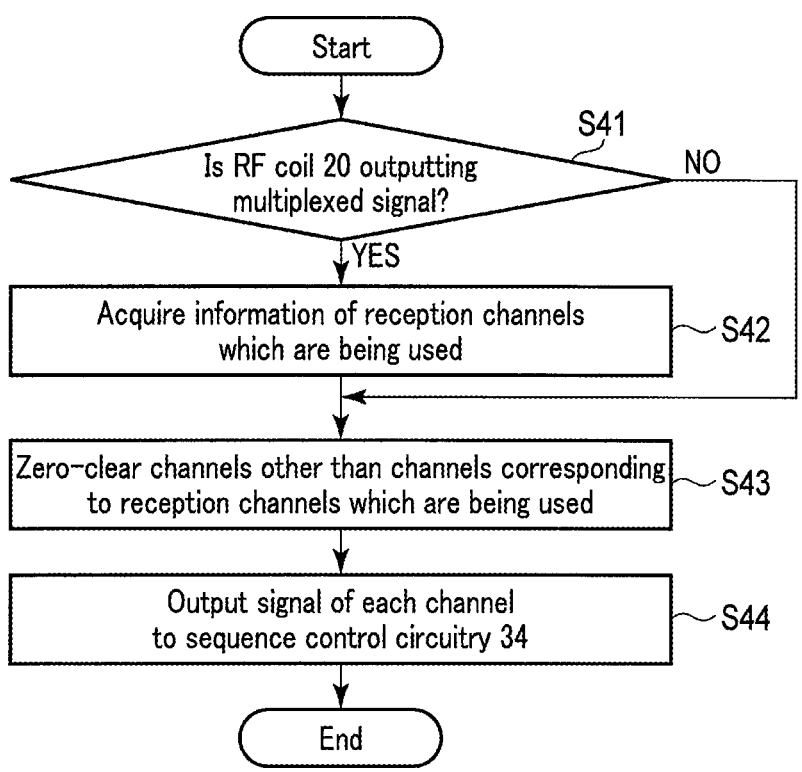
FIG. 10 is a flowchart illustrating a process flow in an RF receiver 32 in the second embodiment, which can process an output signal from an RF coil apparatus which outputs a multiplexed signal or an output signal from an RF coil which does not output a multiplexed signal.

Here, referring to a flowchart of FIG. 10, a description is given of a process flow in the RF receiver 32 which can process an output signal from the RF coil apparatus 20 that outputs a multiplexed signal, or from the RF coil apparatus that does not output a multiplexed signal.

In step S41, the processing circuitry 40 judges, by the judgement function 45, whether a multiplexed signal is being output by the RF coil apparatus 20. For example, the processing circuitry 40 judges whether an analog signal, which is output from the RF coil apparatus 20 to the RF receiver 32, is a multiplexed signal or a signal corresponding to a single channel. When the multiplexed signal is being output from the RF coil apparatus 20, the processing circuitry 40 goes to step S42. When the multiplexed signal is not being output from the RF coil apparatus 20, the processing circuitry 40 goes to step S43.

In step S42, based on the identification information of the RF coil apparatus 20, the processing circuitry 40 acquires, by the judgement function 45, information as to which of the reception channels of the RF coil apparatus 20 that outputs the multiplexed signal are used for the multiplexed signal. The information of reception channels, which are being used, is supplied to the RF receiver 32.

In step S43, the RF receiver 32 executes a signal process on channels corresponding to the reception channels that are being used. The RF receiver 32 zero-clears, for example, the information of the channels which are not being used.

In step S44, the RF receiver 32 outputs the signals of the respective channels to the sequence control circuitry 34.

The above-described configuration of the RF receiver 32 relates to the case in which one RF coil apparatus 20 is connected to the port 501, but the configuration is not limited to this case. For example, the couch body 50 may include a plurality of ports 501. The RF receiver 32 switches the signal process in the RF receiver 32 in accordance with one or plural RF coil apparatuses 20 which are connected.

For example, when the RF coil apparatus 20, which outputs a multiplexed signal, and the RF coil apparatus, which does not output a multiplexed signal, are connected to plural ports 501, the process in the RF receiver 32 can be switched in association with each of the RF coil apparatuses. Furthermore, for example, when RF coil apparatuses 20, which are different with respect to the number of multiplexed channels, are connected to plural ports 501, the process in the RF receiver 32 can be switched in association with each of the RF coil apparatuses.

In the meantime, in the above-described step S43, the case of zero-clearing the information of the channels which are not being used was described by way of example. However, the restriction to this is unnecessary. For example, the arithmetic process itself may not be executed for the channels which are not being used. Specifically, the processing circuitry 40 acquires from the RF coil apparatus 20 the identification information including the number of channels relating to the multiplexing of magnetic resonance signals, judges the number of the channel relating to the composition of magnetic resonance signals having different frequencies, based on the identification information, and specifies at least one separation channels on which the process of separation is to be stopped among a predetermined number of separation channels. Thereby, the RF receiver 32 stops the process of separation for the separation channels that are not used for the process of separation of the digital multiplexed signal among the predetermined number of separation channels.

According to the above-described second embodiment, the processing circuitry 40 switches, by the judgement function 45, the signal process in the RF receiver 32, based on the identification information of the RF coil apparatus 20 that is connected to the couch body 50.

When the RF coil apparatus 20, which outputs the multiplexed signal, is connected to the couch body 50, the RF receiver 32 acquires the information as to how many reception channels are multiplexed, based on the identification information of the RF coil apparatus 20. Then, when the multiplexed signal is separated between the respective channels in the RF receiver 32, the process of separation is executed only for the signals of the used reception channels. Thereby, the RF receiver 32 can executed the process of separation only for the channels corresponding to the reception channels which are multiplexed in the RF coil apparatus 20. Furthermore, since the RF receiver 32 executes the process of separation from the multiplexed signal only for the necessary channels, the calculation amount and the power consumption for the process can be reduced.

In order to adapt to the case in which the RF coil apparatus 20 that does not output a multiplexed signal is connected to the couch body 50, the frequency of a signal of at least one reception channel of the RF coil apparatus 20, which outputs a multiplexed signal, is made to agree with the frequency of a signal which is output from the RF coil apparatus 20 which does not output a multiplexed signal. In addition, the RF receiver 32 executes the process of separation of the multiplexed signal between the respective channels corresponding to the reception channels of the RF coil apparatus 20. Thereby, the RF receiver 32 can process the signal that is output from the RF coil apparatus 20, regardless of whether the RF coil apparatus 20 outputs the multiplexed signal or not.

Additionally, also when a plurality of RF coil apparatuses 20 which are different with respect to the number of multiplexed channels, or the RF coil apparatus 20 that outputs a multiplexed signal and the RF coil apparatus that does not output a multiplexed signal, are connected to plural ports 501 of the couch body 50, the RF receiver 32 can execute the process of separation of the multiplexed signal, in accordance with the kind of the connected RF coil apparatus 20. Specifically, regardless of the presence/absence of multiplexing or the number of multiplexed reception channels, the RF receiver 32 can process the signals which are output from the RF coil apparatus.

(Modification 2)

An RF coil apparatus 20 in a magnetic resonance imaging apparatus 1 according the present modification includes a plurality of coil elements 201, first direct digital synthesizers (hereinafter referred to as "first DDSs"), a digital-to-analog converter (hereinafter "DAC"), multipliers 203, and an adder 206.

The plural coil elements 201 correspond to a plurality of reception channels, and receive a plurality of magnetic resonance signals.

The first DDSs generate, as digital signals, a plurality of first local signals having, respectively, a plurality of first frequencies corresponding to the plural reception channels. Specifically, each of the first DDSs includes an integrator and a memory. The memory stores a correspondence table of a plurality of amplitude values for one cycle to a plurality of phase values (angles) for one cycle, and an integration set value corresponding to the first frequency. The integration set value is preset in accordance with the frequency of a clock signal in the first DDS and the first frequency. The integration set value is digital data indicative of a clock number which is integrated in the clock signal. The integrator integrates the clock number in the clock signal. Each time the integrated clock number reaches the integration set value, the first DDS outputs the amplitude value by referring to the correspondence table, with the integration set value being set as an input phase value. By repeating the integration of the clock number and the output of the amplitude value, the first DDS outputs the digital signal having the first frequency to the DAC.

The first DDSs, the number of which corresponds to the number of the channel of reception channels, are amounted in the RF coil apparatus 20. For example, when the number of channel is four, as shown in FIG. 2, the number of first DDSs is four. In addition, in FIG. 2, the plural first DDSs correspond to the oscillator 204. Incidentally, the number of first DDSs, which are mounted in the RF coil apparatus 20, is not limited to the number of reception channels. For example, a magnetic resonance signal by one reception channel among a plurality of reception channels may not be multiplied by the first local signal. At this time, the number of first DDSs becomes less than the number of reception channels by one.

In addition, a digital signal having a frequency $f_L$ may be generated by one first DDS, and digital signals having a frequency $\Delta f_1$, a frequency $\Delta f_2$, a frequency $\Delta f_3$ and a frequency $\Delta f_4$ may be generated by the other four first DDSs. At this time, the first local signal is generated by multiplying the digital signal having the frequency $f_L$ and the digital signals having the frequencies $\Delta f_n$ (n=1~4). At this time, the number of first DDSs is greater than the number of reception channels by one.

The DAC converts the digital signal to an analog first local signal. The DAC outputs the analog first local signal to the multiplier. The DAC is provided between the oscillator 204 and the multiplier 203.

The multiplier 203 includes a plurality of multiplication circuitry units. The multiplier 203 multiplies a plurality of first local signals by a plurality of magnetic resonance signals on a channel-by-channel basis.

The adder is addition circuitry, and generates an analog multiplexed signal by adding the magnetic resonance signals, which were multiplied by the first local signals, over the channels.

In addition, an RF receiver 32 in the magnetic resonance imaging apparatus 1 according to the present modification includes an analog-to-digital converter (ADC) 321, second direct digital synthesizers (second DDSs), multipliers 322, and filters 324.

The ADC 321 converts the analog multiplexed signal to a digital multiplexed signal.

The second DDSs generate a plurality of second local signals having, respectively, a plurality of second frequencies corresponding to the plural first frequencies. The number of second DDSs corresponds preferably to the number of reception channels. Incidentally, like the above-described number of first DDSs, the number of second DDSs is not limited to the number of reception channels. Besides, in FIG. 4, the plural second DDSs correspond to the oscillator 323.

The filters 324 separate the digital multiplexed signal into the number of channel of reception channels relating to the addition of magnetic resonance signals.

The multipliers 322 multiply, on a channel-by-channel basis, the digital multiplexed signal before separation or the digital multiplexed signal after separation by the second local signal. Specifically, the multipliers may be provided between the filters 324 and ADC 321, as illustrated in FIG. 4, or may be provided between the filters 324 and sequence control circuitry 34.

According to the above-described configurations, the following advantageous effects, in addition to the above-described advantageous effects, can be obtained.

According to the present modification, the first local signal and second local signal can be generated with no phase error by using the DDS. Thereby, the first local signal and second local signal can completely be synchronized. Specifically, the generation of the analog multiplexed signal and the separation of the digital multiplexed signal can be executed with no error. Hence, according to the present modification, an image, in which image degradation due to the multiplexing of magnetic resonance signals is suppressed, can be generated.

(Modification 3)

The present modification differs from Modification 2 in that the oscillator 204, which is mounted in the RF coil apparatus 20, generates analog first local signals. The oscillator 204 is realized by a crystal oscillator using oscillation circuitry, which uses a quartz oscillator, and a frequency divider, a phase-locked loop (hereinafter referred to as "PLL circuitry"), etc. The oscillator 323 in the RF receiver 32 of this modification is realized by the DDS. At this time, the DDS includes a phase reset function of resetting the integration value of the clock number to zero in every cycle of the second local signal. Specifically, the phase reset function is a function of resetting a phase value of a waveform, which is indicative of the second local signal, to zero in every cycle of the second local signal. By the phase reset function, the second local signal can completely be synchronized with the first local signal. Thereby, according to the present modification, the same advantageous effects as in Modification 2 can be obtained.

According to the magnetic resonance imaging apparatus of at least one of the above-described embodiments, in the RF coil apparatus 20, the reception signals are multiplexed over the plural reception channels, and the multiplexed signal is output as the analog signal. The RF receiver 32 converts the analog multiplexed signal to the digital multiplexed signal, and thereafter separates the multiplexed signal between respective channels corresponding to the reception channels, and outputs the separated signals to the sequence control circuitry 34.

Since the signals of the plural reception channels are multiplexed in the RF coil apparatus 20, the number of cables does not increase with an increase in the number of reception channels. In addition, since the number of necessary signal lines does not increase with the increase in the number of reception channels, no alteration is needed for the specifications of the shape of the port.

The RF receiver 32 converts the analog multiplexed signal to the digital multiplexed signal, and thereafter separates the multiplexed signal between respective channels. Thus, compared to the case in which the analog multiplexed signal is separated between the respective channels by analog circuitry and thereafter the separated signals are converted to digital signals, the number of analog circuitry components such as ADCs can be reduced. Therefore, the cost can be reduced. Moreover, the circuitry configuration can be simplified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus comprising:
an RF coil apparatus configured to receive magnetic resonance signals by a plurality of coil elements corresponding to a plurality of channels, to modulate the magnetic resonance signals to have different frequencies for each of the channels, and to output an analog multiplexed signal in which the magnetic resonance signals with different frequencies are composited over the plurality of channels;
a receiver including analog-to-digital conversion circuitry configured to convert the analog multiplexed signal to a digital multiplexed signal, and including a predetermined number of separation channels configured to separate the digital multiplexed signal, based on a number of the channels relating to composition of the magnetic resonance signals with the different frequencies; and
processing circuitry configured to cause, if one or more separation channels among the predetermined number of separation channels are not used in a process of separation of the digital multiplexed signal, the receiver to stop the process of separation for the one or more separation channels.

2. The magnetic resonance imaging apparatus according to claim 1, wherein the processing circuitry is configured to acquire, from the RF coil apparatus, identification information including the number of the channel relating to multiplexing of the magnetic resonance signals, to judge the number of the channel relating to the composition based on the identification information, and to specify at least one separation channel on which the process of separation is to be stopped among the predetermined number of separation channels.

3. The magnetic resonance imaging apparatus according to claim 1, wherein the RF coil apparatus further includes multiplication circuitry configured to multiply, with respect to each of the channels, each of a plurality of local signals with the frequencies which are different between the channels, by each of the magnetic resonance signals which are output from the channels, respectively.

4. The magnetic resonance imaging apparatus according to claim 2, wherein the processing circuitry is configured to judge whether an analog signal which is output from the RF coil apparatus to the receiver is the multiplexed signal or a signal corresponding to a single channel.

5. The magnetic resonance imaging apparatus according to claim 1, wherein the receiver further includes an oscillator configured to generate local signals having frequencies which are different between the channels, and
each of the separation channels includes:
multiplication circuitry configured to multiply the digital multiplexed signal by the local signals and to output signals having frequency bands which are common between the separation channels; and
a filter configured to pass the signals which are output from the multiplication circuitry, by using pass bands which are common between the separation channels.

6. A magnetic resonance imaging apparatus comprising:
an RF coil apparatus including a plurality of coil elements which correspond to a plurality of channels and are configured to receive a plurality of magnetic resonance signals, an oscillator configured to generate a plurality of first local signals having, respectively, a plurality of first frequencies corresponding to the plurality of channels, a multiplier configured to multiply, with respect to each of the channels, the plurality of magnetic resonance signals by the plurality of first local signals, and composition circuitry configured to generate an analog multiplexed signal by adding the magnetic resonance signals which were multiplied by the first local signals, over the channels; and
a receiver including an analog-to-digital converter configured to convert the analog multiplexed signal to a digital multiplexed signal, and a direct digital synthesizer configured to generate a plurality of second local signals having, respectively, a plurality of second frequencies corresponding to the first frequencies, the receiver being configured to separate the digital multiplexed signal into a number of the channels relating to an addition of the magnetic resonance signals, and to multiply, with respect to each of the channels, the digital multiplexed signal before the separation or the digital multiplexed signal after the separation by the second local signals.

7. The magnetic resonance imaging apparatus according to claim 6, wherein the oscillator is a direct digital synthesizer configured to generate a digital signal corresponding to the first local signal, and
the RF coil apparatus further includes a digital-to-analog converter configured to convert the digital signal to the first local signal which is an analog signal.

8. The magnetic resonance imaging apparatus according to claim 6, wherein the oscillator is configured to generate the first local signal which is an analog signal, and
the direct digital synthesizer is configured to reset a phase value of a waveform which is indicative of the second local signal, in every cycle of the second local signal.

9. The magnetic resonance imaging apparatus according to claim 6, wherein the receiver includes a filter configured to separate the digital multiplexed signal by using a pass band corresponding to the second frequency.

* * * * *